(12) United States Patent
Fishman

(10) Patent No.: US 8,729,435 B2
(45) Date of Patent: May 20, 2014

(54) PURIFICATION OF SILICON BY ELECTRIC INDUCTION MELTING AND DIRECTIONAL PARTIAL COOLING OF THE MELT

(75) Inventor: Oleg S. Fishman, Maple Glen, PA (US)

(73) Assignee: Inductotherm Corp., Rancocas, NJ (US)

( * ) Notice: Subject to any disclaimer, the term of this patent is extended or adjusted under 35 U.S.C. 154(b) by 924 days.

(21) Appl. No.: 12/625,346

(22) Filed: Nov. 24, 2009

(65) Prior Publication Data

US 2010/0135888 A1 Jun. 3, 2010

Related U.S. Application Data

(60) Provisional application No. 61/118,729, filed on Dec. 1, 2008.

(51) Int. Cl.
*H05B 6/42* (2006.01)
(52) U.S. Cl.
USPC .......................................................... 219/677
(58) Field of Classification Search
USPC ................... 219/677; 373/139, 141, 144, 165
See application file for complete search history.

(56) References Cited

U.S. PATENT DOCUMENTS

| | | | | |
|---|---|---|---|---|
| 3,261,676 A * | 7/1966 | Morelock | | 65/17.6 |
| 4,617,041 A * | 10/1986 | Meerman | | 65/385 |
| 4,738,713 A * | 4/1988 | Stickle et al. | | 75/10.18 |
| 4,915,723 A | 4/1990 | Kaneko et al. | | |
| 4,923,508 A * | 5/1990 | Diehm et al. | | 75/10.14 |
| 5,268,063 A * | 12/1993 | Kaneko et al. | | 117/32 |
| 5,283,805 A * | 2/1994 | Kawano et al. | | 373/156 |
| 5,510,095 A * | 4/1996 | Aratani et al. | | 423/348 |
| 5,643,350 A * | 7/1997 | Mason et al. | | 65/158 |
| 6,577,667 B1 * | 6/2003 | Romer et al. | | 373/156 |
| 6,695,035 B2 * | 2/2004 | Kimura et al. | | 164/507 |
| 6,757,317 B2 * | 6/2004 | Kunert et al. | | 373/138 |
| 6,993,061 B2 * | 1/2006 | Roach et al. | | 373/146 |
| 6,996,153 B2 * | 2/2006 | Brun et al. | | 373/155 |
| 7,110,430 B2 * | 9/2006 | Lazor | | 373/144 |
| 7,113,535 B2 * | 9/2006 | Tenzek et al. | | 373/151 |
| 7,497,986 B2 * | 3/2009 | Bewlay et al. | | 266/201 |
| 7,682,472 B2 * | 3/2010 | Kaneko | | 148/538 |
| 7,749,324 B2 * | 7/2010 | Yoshihara et al. | | 117/18 |
| 7,792,178 B2 * | 9/2010 | Tenzek et al. | | 373/151 |
| 8,025,735 B2 * | 9/2011 | Lee et al. | | 118/727 |
| 2006/0042725 A1 * | 3/2006 | Bewlay et al. | | 148/237 |
| 2007/0081572 A1 * | 4/2007 | Fishman et al. | | 373/142 |

* cited by examiner

*Primary Examiner* — Colleen Dunn
(74) *Attorney, Agent, or Firm* — Philip O. Post

(57) ABSTRACT

The present invention is apparatus for, and method of, purification of silicon by electric induction heating and melting of silicon in a crucible or susceptor vessel, with subsequent directional partial cooling of the silicon melt to an initial amorphous-to-crystalline (solidification) temperature to produce a directionally solidified purified quantity of silicon and a separate quantity of high impurity silicon. The quantity of high impurity silicon is removed from the vessel and the purified quantity of silicon at solidification temperature is remelted in the vessel for removal from the vessel or further processing.

14 Claims, 9 Drawing Sheets

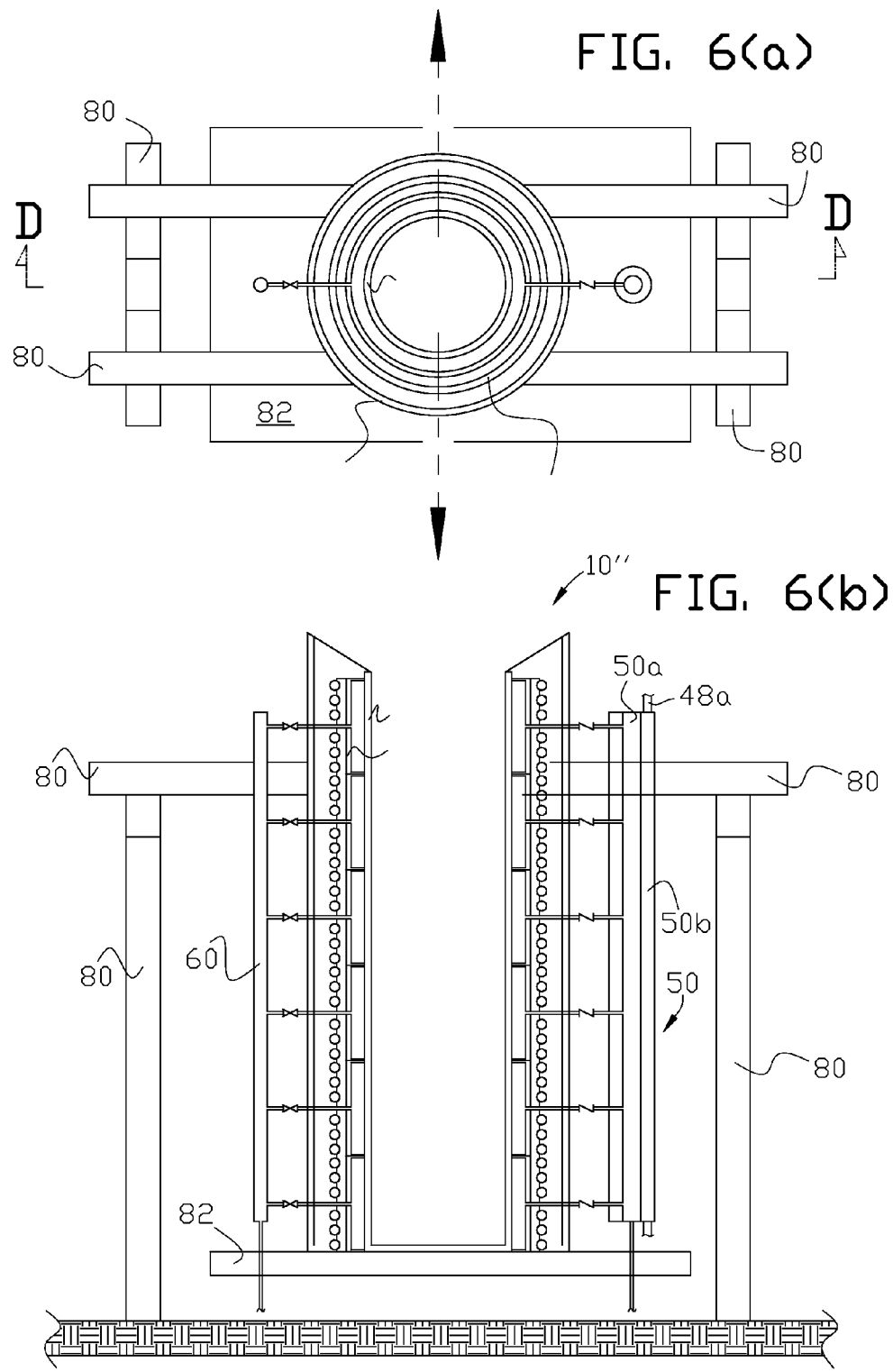

PURIFICATION OF SILICON BY ELECTRIC INDUCTION MELTING AND DIRECTIONAL PARTIAL COOLING OF THE MELT

CROSS REFERENCE TO RELATED APPLICATIONS

This application claims the benefit of U.S. Provisional Application No. 61/118,729, filed Dec. 1, 2008, hereby incorporated by reference in its entirety.

FIELD OF THE INVENTION

The present invention relates to purification of silicon by electric induction melting of silicon in a vessel with subsequent directional partial cooling of the silicon melt to a temperature that results in impurities rising to the top of the partially cooled silicon melt, or towards the central core of the partially cooled silicon melt, followed by remelting of the partially cooled silicon melt for further processing.

BACKGROUND OF THE INVENTION

High purity polycrystalline silicon is used in the shape of wafers for semiconductor devices and solar cells. Polycrystalline silicon of a lower purity than semiconductor grade silicon that is described in the art as upgraded metallurgical grade (UMG) silicon can be used to produce solar cells. The tradeoff for lower purity is less efficient solar cells at a lower initial cost since silicon does not have to go through as many refining stages from its naturally found metallic or silicon oxide state.

One method of purifying silicon is disclosed in U.S. Pat. No. 7,197,061. In that patent a material, such as silicon, can be melted and directionally solidified in a vessel by utilization of electric induction power. Separate induction coils are provided along the exterior height of the vessel so that electric power can be sequentially removed (starting from the bottom of the vessel) once all material in the vessel has been melted. Initially all induction coils are powered from an alternating current (ac) source to melt all silicon in the vessel; silicon has a nominal melting point of 1,410° C. In this process, known as directional solidification or heat exchanger process, impurities in the silicon melt move to the top of the silicon melt/solid interface boundary as the silicon melt directionally solidifies from the bottom of the vessel. At completion of total directional solidification of the melt, a solid section of highly impure silicon is at the top of a solid section of highly purified silicon. The patent also discloses circulating a cooling medium in each induction coil after electric power is removed to hasten solidification of the silicon melt.

Other techniques involve utilizing a heat removal source, such as a chill plate, below the bottom of the vessel after all the silicon in the vessel has been melted and the heating source has been removed. A disadvantage of this method is that the rate of vertical movement of the silicon melt/solid interface during the directional solidification process is slow because of the application of the heat removal source from the bottom of the vessel.

It is one object of the present invention to provide apparatus for, and method of, directionally solidifying a material in a vessel with an improved solidification rate over that achievable with a bottom heat removal source.

It is another object of the present invention to provide apparatus for, and method of, producing a purified material in a vessel by directional partial solidification (cooling) of the material to the nominal amorphous-to-crystalline transition (solidification) temperature of the material, and then re-melting the purified material for either further purification by directional solidification or withdrawal from the vessel as a molten material.

BRIEF SUMMARY OF THE INVENTION

In one aspect the present invention is apparatus for, and method of, purification of silicon by at least partial electric induction melting of a silicon charge in a crucible or susceptor vessel to form a molten quantity of silicon in the vessel with subsequent directional partial cooling of the molten silicon to an initial solidification temperature by means of one or more cooling jackets surrounding the exterior height of the vessel so that impurities rise to the top of the partially cooled silicon, or migrate to the central axial region of the vessel, without total solidification of the silicon in the vessel before remelting the silicon in the vessel.

The above and other aspects of the invention are set forth in this specification and the appended claims.

BRIEF DESCRIPTION OF THE DRAWINGS

The foregoing brief summary, as well as the following detailed description of the invention, is better understood when read in conjunction with the appended drawings. For the purpose of illustrating the invention, there is shown in the drawings exemplary forms of the invention that are presently preferred; however, the invention is not limited to the specific arrangements and instrumentalities disclosed in the following appended drawings:

FIG. 6(a) illustrates in plan top view another example of an apparatus used in the present invention.

FIG. 6(b) illustrates in cross sectional elevation view (through line D-D) the apparatus shown in FIG. 6(a).

DETAILED DESCRIPTION OF THE INVENTION

Figure 1A:
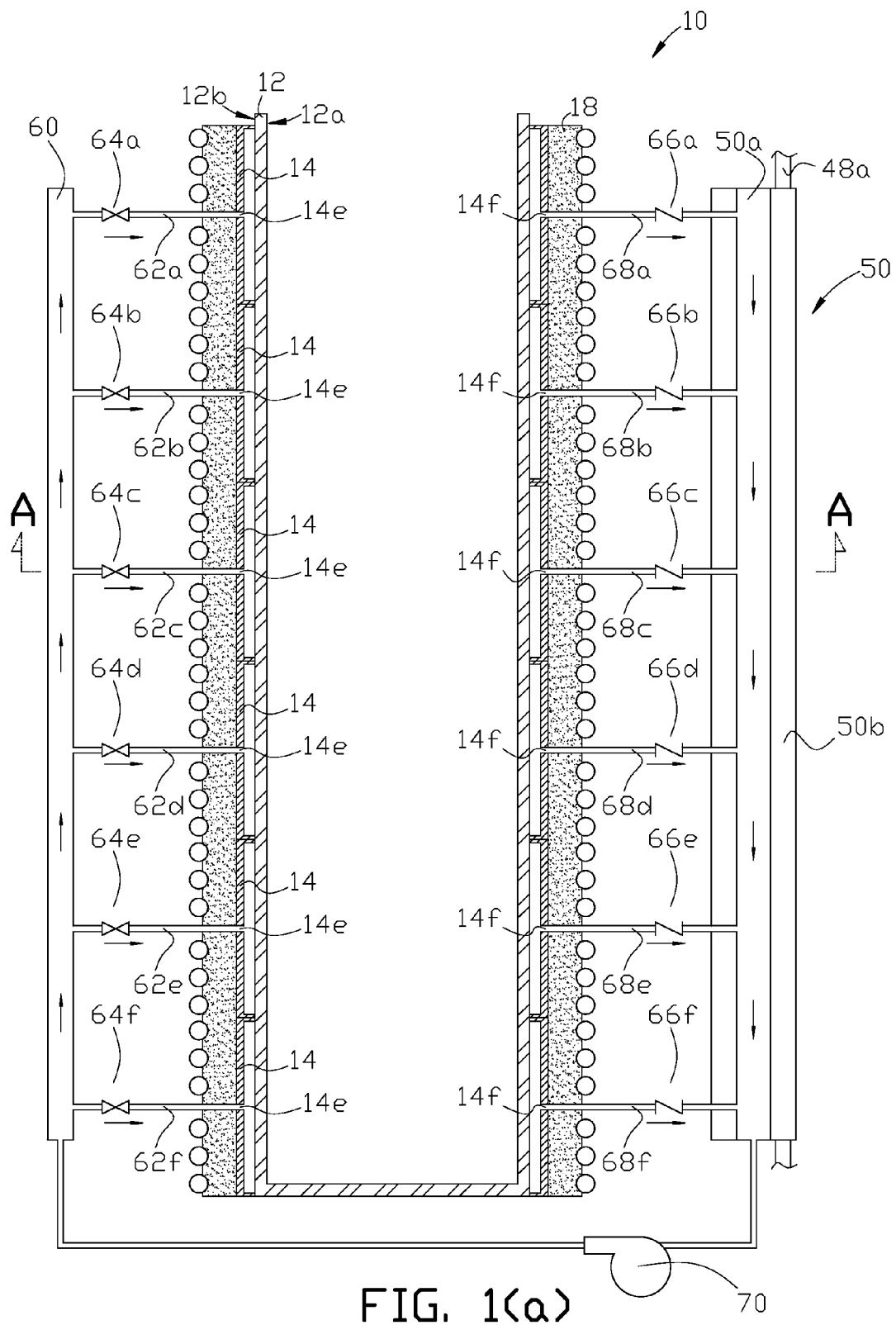
FIG. 1(a) illustrates in cross sectional elevation view one example of an apparatus used in the present invention.

There is shown in FIG. 1(a) one example of apparatus 10 for purification of a composition, such as silicon, by electric induction melting of the composition and subsequent directional cooling of the molten composition to at least the initial amorphous-to-crystalline phase transition (solidification) temperature of the molten composition. Vessel 12 can comprise either a crucible of suitable refractory or, at least partially, a susceptor. A suitable liner material, or coating, can be applied to the interior wall 12a of the vessel to prevent contamination, or reaction, of the material forming the vessel with the composition melted and partially solidified within the vessel.

Figure 2A:
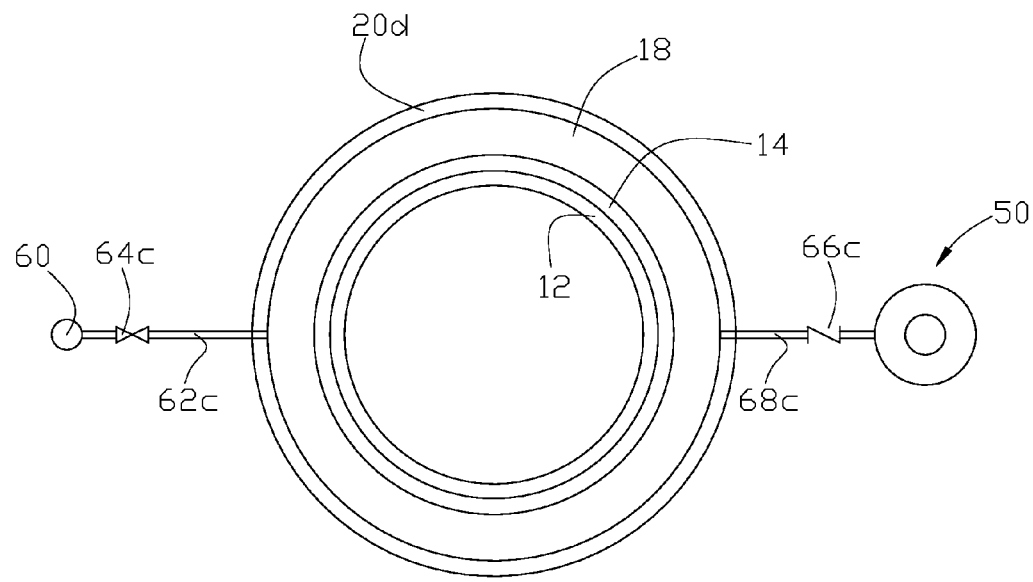
FIG. 2(a) illustrates in cross sectional plan view the apparatus in FIG. 1(a) through line A-A.
Figure 2B:
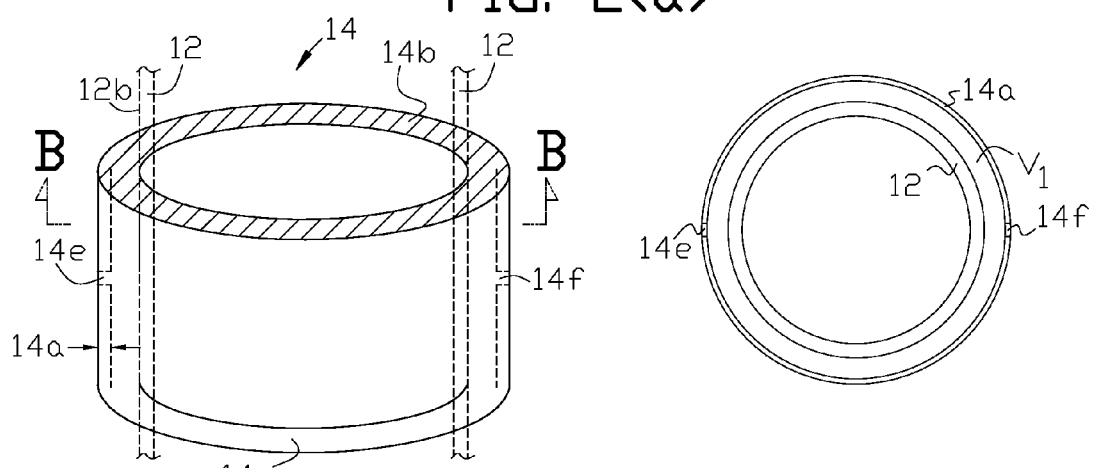
FIG. 2(b) illustrates in isometric and cross sectional view (through line B-B) one example of a cooling sleeve or jacket that can be used with the apparatus shown in FIG. 1(a).

Multiple vessel cooling sleeves or jackets 14 are stacked around the height of the exterior wall 12b of the vessel. Jacket outer wall 14a is connected to jacket top and bottom annular sections 14b and 14c, respectively, as shown in FIG. 2(b). In this particular example of the invention, the vessel's exterior wall 12b forms the interior wall of each cooling jacket so that each jacket forms a substantially enclosed annular chamber, $V_1$, around the exterior of the vessel that is bounded by the jacket outer wall, top and bottom sections, and the exterior wall of the vessel. At least one inlet 14e to, and at least one outlet 14f from, the enclosed annular volume, as shown, for example, in detail in FIG. 2(b) is provided for each of the cooling jackets.

Figure 2C:
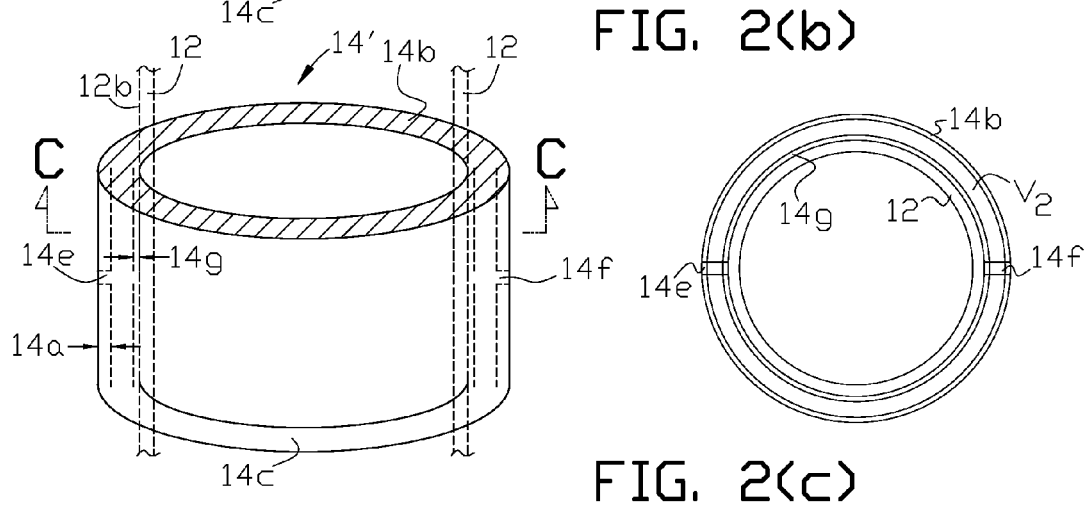
FIG. 2(c) illustrates in isometric and cross sectional view (through line C-C) another example of a cooling sleeve or jacket that can be used with the apparatus shown in FIG. 1(a).

In other examples of the invention the interior wall 14g of each jacket 14' may be integrally formed with the cooling jacket and fitted around the height of the exterior wall 12b of the vessel as shown in FIG. 2(c). In these examples substantially enclosed annular volume, $V_2$, is bounded by the jacket interior and outer walls and interconnecting top and bottom sections. Further interior wall 14g may be perforated with openings to enhance conduction of heat from the molten composition within the vessel during the solidification process step as further described below.

Each cooling jacket is formed from a material having a plastic deformation temperature above the maximum operating temperature at the vessel's exterior wall 12b. Further the cooling jacket material is selected for no, or minimal, magnetic coupling (electromagnetically transparent) with the flux generated by the magnetic field from current flow in the induction coils as described below. For example a high temperature ceramic composite is one type of suitable material that may be used to cast each cooling jacket.

Figure 4:
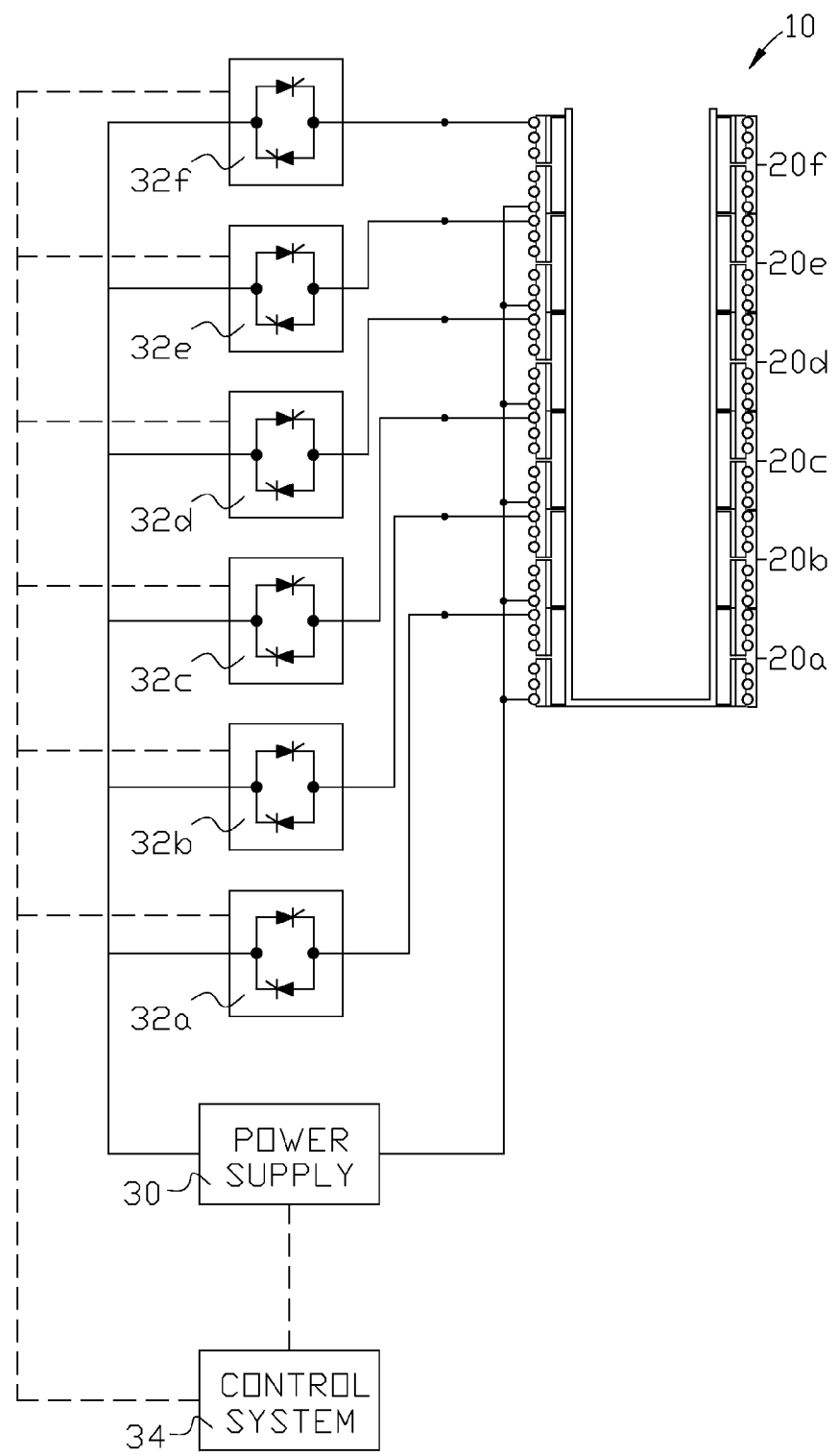
FIG. 4 illustrates one example of a power system for supplying electric power to the induction coils used with an apparatus of the present invention.

In this particular example of the invention, a separate induction coil (20a to 20f) surrounds the exterior height of each jacket as shown in FIG. 4. In other examples of the invention other arrangements of a plurality of induction coils, relative to the number of cooling jackets, may be used. For example two separate induction coils may each surround one-half of the height of each cooling sleeve, or a single induction coil may surround the height of each one and one-half cooling jackets.

A suitable thermal insulation material 18 can be located between the plurality of induction coils and the plurality of stacked cooling jackets to isolate the cooling jackets from Joule heating radiated by current flow in the induction coils.

The cooling system for the plurality of cooling jackets is a vertically sectionalized closed system. Referring to FIG. 1(a) sectionalized cooling system header 60 supplies a suitable jacket cooling medium to inlet 14e of each stacked cooling jacket via separate supply lines 62a through 62f. Valves 64a through 64f selectively control the flow of the cooling medium to each cooling jacket. The jacket cooling medium exits each jacket at outlet 14f and is fed to interior chamber 50a of cooling medium heat exchanger 50 via return lines 68a through 68f where heat is removed from the cooling medium by a liquid, or gas, flowing through surrounding jacket 50b as further described below. Valves 66a through 66f can be provided in each return line as required to control flow of the jacket cooling medium. The jacket cooling medium from chamber 50a is pumped back to header 60 via circulation pump 70. The jacket cooling medium may be a liquid or a gas composition having a high heat absorption value such as argon. Although the cooling heat exchanger shown in this example is a tubular heat exchanger other types of heat exchangers may be utilized.

One suitable example of a power system for the supply of power to each of the plurality of induction coils in this particular example of the invention is illustrated in FIG. 4. Power supply 30 is a suitable alternating current source that can selectively supply power to one or more of the plurality of induction coils 20a through 20f via switching devices 32a through 32f and control system 34.

Figure 5:
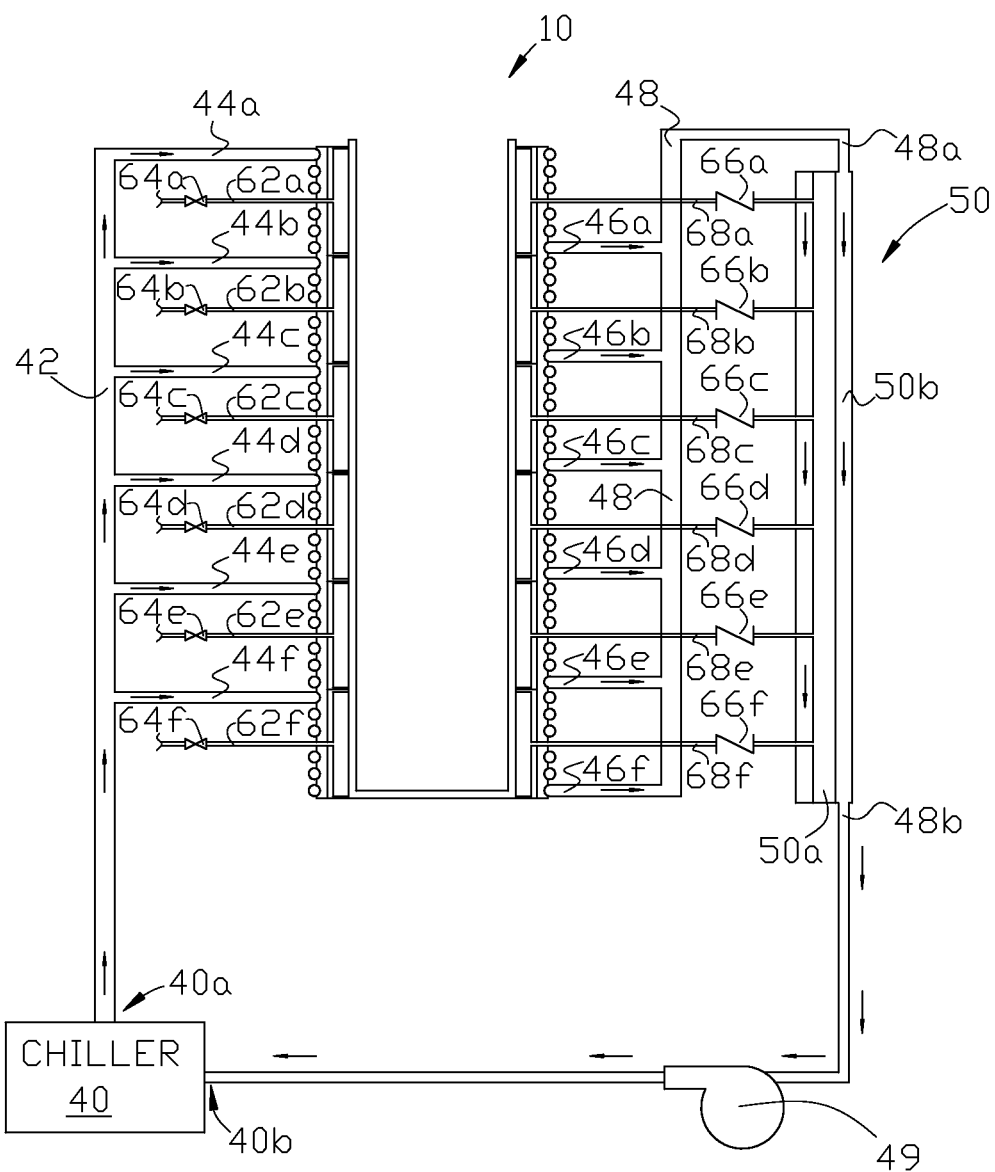
FIG. 5 illustrates one example of a cooling system used with an apparatus of the present invention for cooling the induction coils used with the apparatus, and for providing a cooling medium to a heat exchanger to remove heat from the cooling medium flowing through one or more cooling sleeves or jackets used in the apparatus.

One suitable example of a cooling system for the induction coils in this particular example is illustrated in FIG. 5. In this particular example the induction coil cooling medium, which can be a gas or liquid, for example, water, is also used to remove heat from the cooling medium circulating through the cooling jackets surrounding the vessel during the directional solidification step as further described below. The coil cooling system is a closed system comprising at least one chiller 40 for removing heat from the cooling medium. Chiller output 40a supplies cooling water to coil supply header 42. Coil cooling water supply conduits 44a through 44f supply cooling water to each induction coil, which flows through the hollow interior of each induction coil (or separate cooling coils arranged around the induction coils), and then through coil cooling water return conduits 46a through 46f to feed coil return header 48, which is connected to external annular jacket 50b of heat exchanger 50 where the coil cooling water removes heat from the jacket cooling medium flowing through interior cylindrical chamber 50a of the heat exchanger as described above. From the heat exchanger, the coil cooling water is pumped back to input 40b of chiller 40 by circulation pump 49.

Figure 1B:
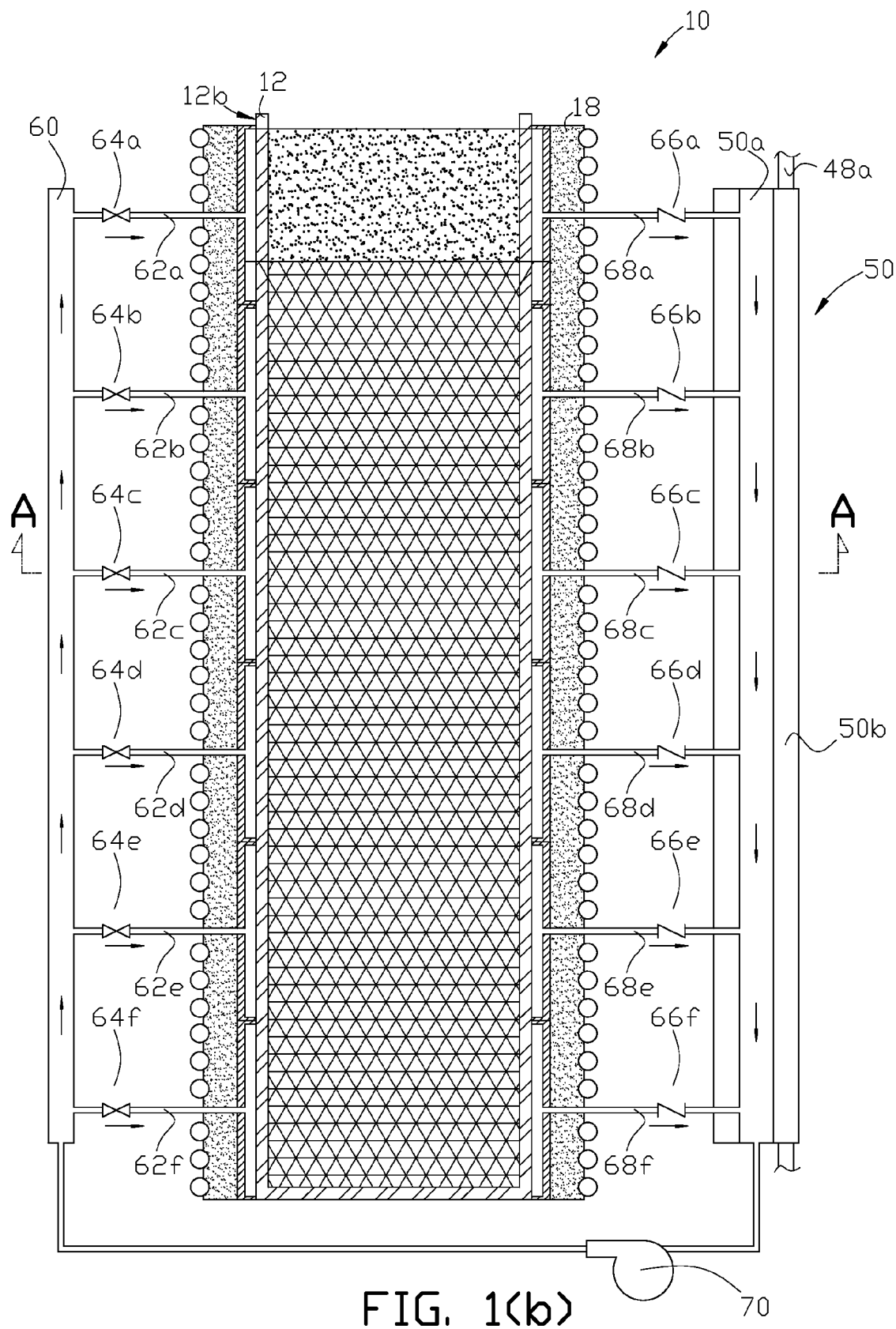
FIG. 1(b) is the apparatus in FIG. 1(a) shown with directionally purified material and impurities at the top of the purified material with the directionally purified material at its amorphous-to-crystalline solidification temperature.

In this particular example of the invention, initially all silicon, for example, in the vessel is melted by supplying ac power to all induction coils. In other examples of the invention, some or all of the induction coils may be selectively energized simultaneously or in sequence to achieve satisfactory melting of the silicon in the vessel. Power is sequentially removed from the bottom coil 20a to top coil 20f, and the jacket cooling medium is permitted to flow through each ascending cooling jacket adjacent to each de-energized coil to directionally solidify the silicon melt from the bottom to the top of the vessel, preferably, only to the initial solidification temperature (amorphous-to-crystalline phase transition) of silicon, which is nominally 1,380° C., as shown, for example, in FIG. 1(b) where the crosshatched region represents the purified silicon quantity at the initial solidification temperature, and the stippled region represents the high impurity silicon quantity. At this point the molten (or semi-solid) section of high impurity silicon composition at the top of the vessel is removed by any suitable means such as a ladle or suction apparatus. Subsequent to removal of the high impurity silicon, the induction coils are then reenergized to melt the remaining purified silicon either for repetition of the directional solidification process, or for removal of the purified melt from the vessel via any suitable means. FIG. 6(a) and FIG. 6(b) illustrate one example of a pouring system where a tilting vessel 10" is used for pouring the purified silicon melt from the vessel by tilting mechanism 80. Selected components of the system, as shown, for example, in FIG. 6(b) can be located on vessel platform 82, which can tilt with the vessel.

If the vessel is a refractory crucible, a molten silicon heel induction melting process is used so that solid silicon added to the vessel will come in contact with the electrically conductive molten silicon heel to melt the non-electrically conductive solid silicon. If the vessel is at least partially constructed from one or more susceptors, inductive susceptor heating may be utilized to at least initially heat solid silicon placed in the vessel by heat conduction from the susceptor to the solid silicon.

Figure 3:
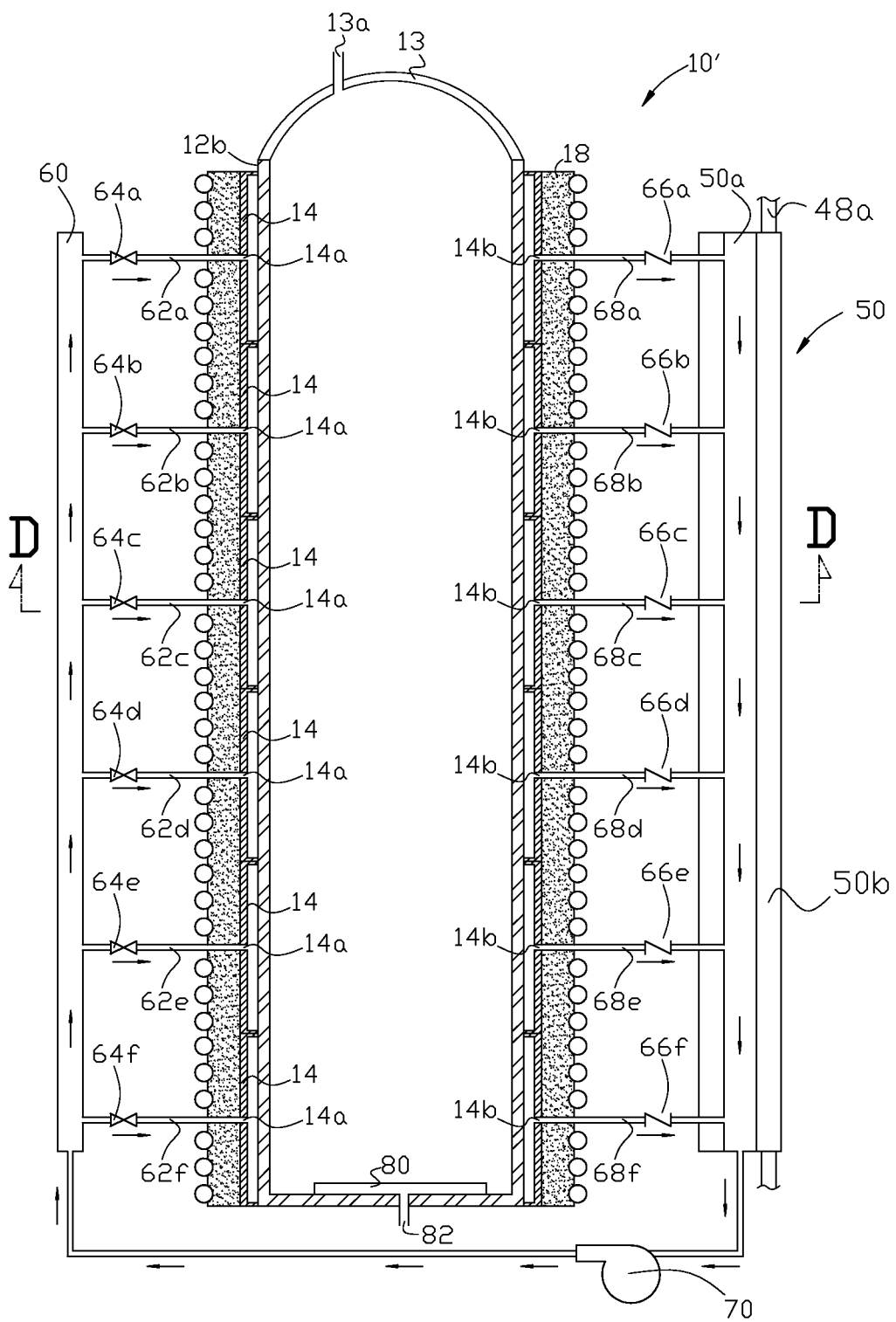
FIG. 3 illustrates in cross sectional elevation view another example of an apparatus used in the present invention.

FIG. 3 illustrates an alternative arrangement of the present invention wherein a vacuum vessel 10' is utilized to achieve a vacuum, or other contained environment, over the silicon in the vessel. In addition to purification by directional solidification as described above, boron and/or phosphorous impurities may be removed from the silicon melt by a process of degasification by injecting one or more gases into porous material 80 through conduit 82, which percolates through the porous material and bubbles up through the silicon melt. For boron, steam is used as the reacting gas for the reduction of boron impurities. For phosphorus, argon is used as the reacting gas at low pressure. Consequently degasification occurs with a vacuum environment over the surface of the melt, for example, by using a sealing lid 13 on the furnace or situating the entire furnace in a vacuum chamber. Vessel lid 13 can be selectively removed from the top of the vessel, and can contain one or more suitable ports 13a for selectively drawing a vacuum over the top surface of the material in the vessel.

Figure 7A:
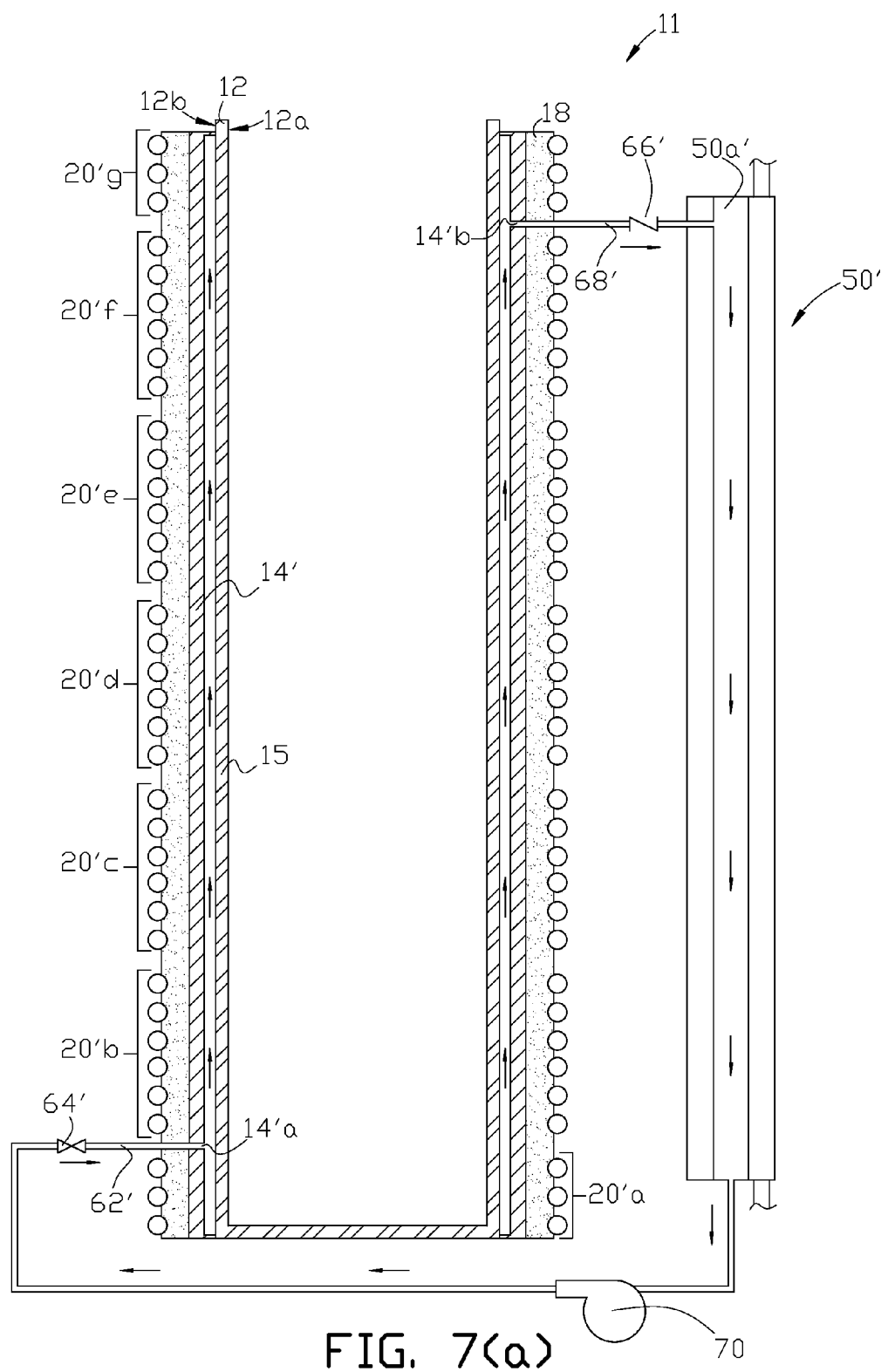
FIG. 7(a) illustrates in cross sectional elevation view another example of an apparatus used in the present invention.
Figure 7C:
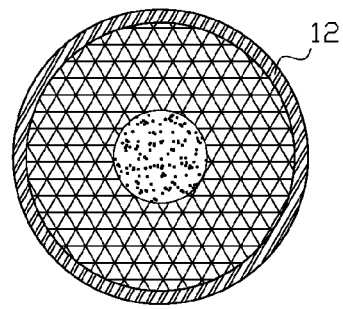
FIG. 7(c) is a cross sectional view (through line E-E) of the apparatus shown in FIG. 7(b).
Figure 7B:
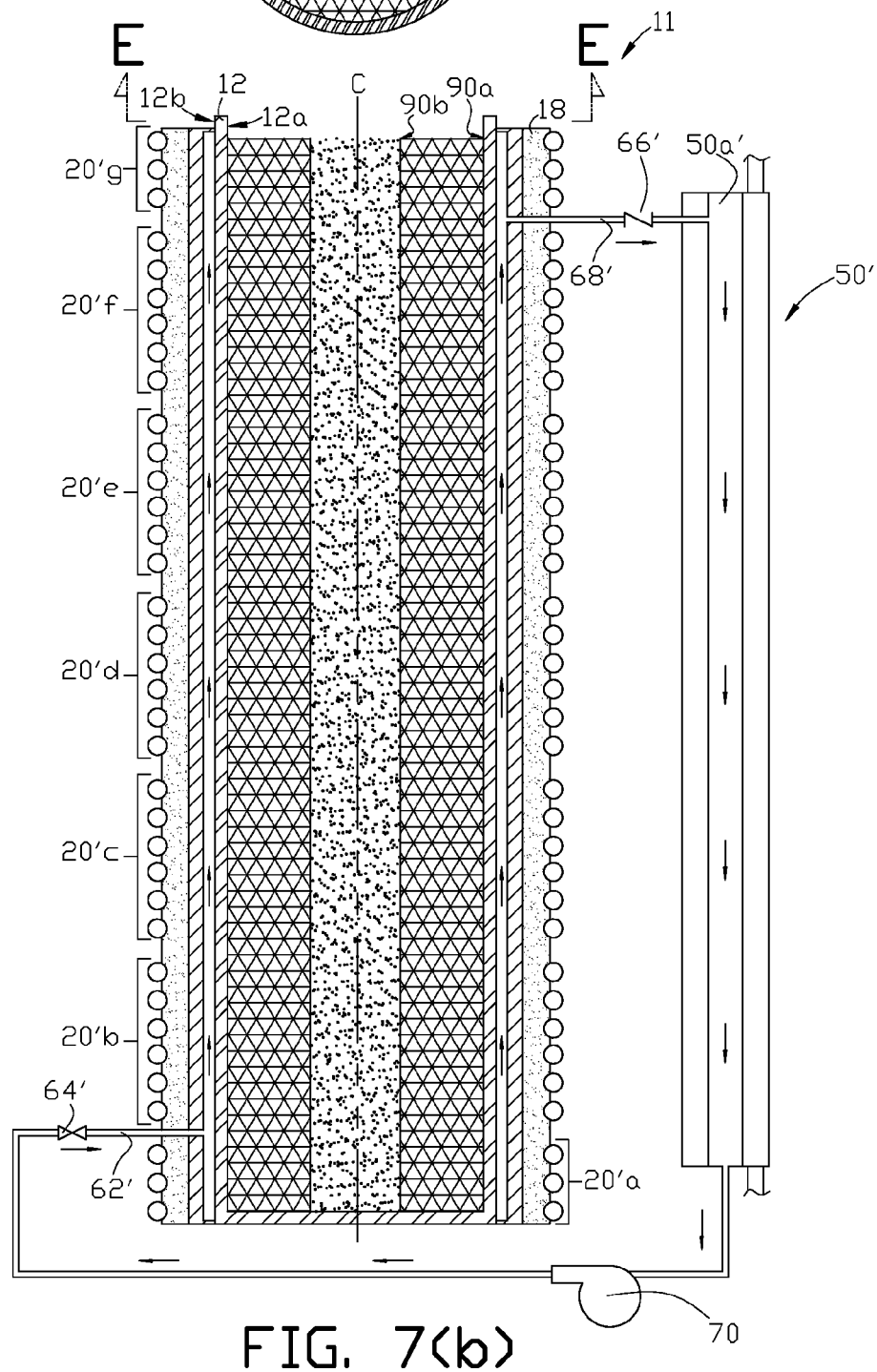
FIG. 7(b) is the apparatus in FIG. 7(a) shown with directionally purified material and impurities within the central core of the purified material with the directionally purified material at its amorphous-to-crystalline solidification temperature.

An objective of the above examples of the invention is to have the impurities in the silicon melt rise to the top of the silicon material in the vessel as the silicon material is cooled and partially solidified in the vessel. Alternatively a single integral cooling jacket 15 may be placed around the entire exterior height of the vessel as shown in FIG. 7(a) so that the cooling gradient progresses radially inward along the entire vertical height of the melt to the interior of the melt as shown in FIG. 7(b) and FIG. 7(c), rather than from top to bottom. That is after the silicon is completely melted in the vessel by alternating current flow through one or more induction coils surrounding the vessel, a cooling medium can be flowed through single integral cooling jacket 15 (or simultaneously through a plurality of cooling jackets surrounding the vessel) to establish the partial solidification pattern shown in FIG. 7(b) and FIG. 7(c). For example if the molten mass inside the vessel is cylindrical in shape, cooling progresses from the outer radial side wall of the cylindrical mass 90a towards the central axis, C, of the vessel to region 90b. In this manner the high impurity silicon quantity migrates around the central axis of the melt, and can be poured out of the vessel so that an annular cylindrical quantity of purified silicon at the initial amorphous-to-crystalline temperature remains in the vessel for remelting similar to the remelting process for the vertically oriented directional solidification process as described above.

The above examples of the invention have been provided merely for the purpose of explanation and are in no way to be construed as limiting of the present invention. While the invention has been described with reference to various embodiments, the words used herein are words of description and illustration, rather than words of limitations. Although the invention has been described herein with reference to particular means, materials and embodiments, the invention is not intended to be limited to the particulars disclosed herein; rather, the invention extends to all functionally equivalent structures, methods and uses. Those skilled in the art, having the benefit of the teachings of this specification, may effect numerous modifications thereto, and changes may be made without departing from the scope of the invention in its aspects.

The invention claimed is:

1. An apparatus for inductively melting a silicon and partially cooling the molten silicon to its initial solidification temperature to produce a quantity of purified silicon at its initial solidification temperature separate from a quantity of high impurity molten silicon, the apparatus comprising:

a vessel for containment of the silicon;

a plurality of cooling jackets adjacently disposed vertically around the height of the exterior wall of the vessel, each of the plurality of cooling jackets formed from a high temperature ceramic composite, each of the plurality of cooling jackets having at least one inlet and at least one outlet;

a plurality of induction coils disposed vertically around the exterior height of the at least one cooling jacket, each of the plurality of induction coils having alternating current power supply terminals and disposed exclusively around one of the plurality of cooling jackets, the apparatus further comprising a control system for sequentially removing an alternating power source from each one of the plurality of induction coils and initiating a supply of a cooling jacket cooling medium to the one of the plurality of cooling jackets disposed adjacent to the one of the plurality of induction coils from which the alternating power source is removed so that the vessel vertically separates the quantity of purified silicon at its initial solidification temperature from the quantity of high impurity molten silicon;

an induction coil cooling system comprising:
  a coil chiller having an outlet and an inlet for supply and return, respectively, of a coil cooling medium;
  a coil cooling supply header for receiving the coil cooling medium from the outlet of the coil chiller and supplying the coil cooling medium to cooling passages associated with the plurality of induction coils;
  a coil cooling return header for receiving the coil cooling medium from the cooling passages associated with the plurality of induction coils, the coil cooling return header supplying the coil cooling medium to the cooling jacket heat exchanger for removal of heat in the cooling jacket cooling medium; and
  a coil cooling circulation pump for receiving the coil cooling medium from the cooling jacket heat exchanger and supplying the coil cooling medium to the inlet of the coil chiller; and a cooling jacket cooling system for selectively circulating the cooling jacket cooling medium through the plurality of cooling jackets, the cooling jacket system comprising:
  a cooling medium circulation pump;
  a cooling jacket supply header for receiving the cooling jacket cooling medium from the outlet of the cooling medium circulation pump and supplying the cooling jacket cooling medium to the at least one inlet of the cooling jacket so that the quantity of high impurity molten silicon migrates around the central axis of the quantity of purified silicon at its initial solidification temperature; and a cooling jacket heat exchanger for receiving the cooling jacket cooling medium from the at least one outlet of the single cooling jacket and supplying the cooling jacket cooling medium to the inlet of the cooling medium circulation pump.

2. An apparatus for inductively melting a silicon and partially cooling the molten silicon to its initial solidification temperature to produce a quantity of purified silicon at its initial solidification temperature separate from a quantity of high impurity molten silicon, the apparatus comprising:

a vessel for containment of the silicon;

a cooling jacket adjacently disposed vertically around the height of the exterior wall of the vessel so that the vessel radially separates the quantity of purified silicon at its initial solidification temperature from the quantity of high impurity molten silicon, the cooling jacket formed from a high temperature ceramic composite and having least one inlet and at least one outlet;

a plurality of induction coils disposed vertically around the exterior height of the cooling jacket, each of the plurality of induction coils having alternating current power supply terminals; and a cooling jacket cooling system for selectively circulating a cooling jacket cooling medium through the cooling jacket, the cooling jacket system comprising:

a cooling medium circulation pump;

a cooling jacket supply header for receiving the cooling jacket cooling medium from the outlet of the cooling medium circulation pump and supplying the cooling jacket cooling medium to the at least one inlet of the cooling jacket so that the quantity of high impurity molten silicon migrates around the central axis of the quantity of purified silicon at its initial solidification temperature; and a cooling jacket heat exchanger for receiving the cooling jacket cooling medium from the at least one outlet of the single cooling jacket and supplying the cooling jacket cooling medium to the inlet of the cooling medium circulation pump.

3. The apparatus of claim 1 wherein each one of the plurality of cooling jackets comprises a vertically oriented jacket outer wall having an inwardly oriented open jacket annular top and bottom walls so that when each one of the plurality of cooling jacket is disposed vertically around the height of the exterior wall of the vessel, the section of the exterior wall between the jacket annular top and bottom walls forms a substantially closed volume with the jacket outer, top and bottom walls, the at least one inlet and the at least one outlet in the jacket outer wall opening into the substantially closed volume.

4. The apparatus of claim 1 wherein each one of the plurality of cooling jacket comprises a vertically oriented jacket outer wall having an inwardly oriented closed jacket top and bottom annular walls having their inner perimeters connected to a vertically oriented jacket inner wall so that a substantially closed volume is formed between the jacket outer, top bottom and inner walls, the at least one inlet and the at least one outlet in the jacket outer wall opening into the substantially closed volume.

5. The apparatus of claim 4 further comprising a plurality of perforations in the jacket inner wall.

6. The apparatus of claim 2 further comprising an induction coil cooling system comprising:

a coil chiller having an outlet and an inlet for supply and return, respectively, of a coil cooling medium;

a coil cooling supply header for receiving the coil cooling medium from the outlet of the coil chiller and supplying the coil cooling medium to cooling passages associated with the plurality of induction coils;

a coil cooling return header for receiving the coil cooling medium from the cooling passages associated with the plurality of induction coils, the coil cooling return header supplying the coil cooling medium to the cooling jacket heat exchanger for removal of heat in the cooling jacket cooling medium; and a coil cooling circulation pump for receiving the coil cooling medium from the cooling jacket heat exchanger and supplying the coil cooling medium to the inlet of the coil chiller.

7. The apparatus of claim 1 further comprising a vacuum apparatus for maintaining the silicon in the vessel at near vacuum conditions or other controlled environment.

8. The apparatus of claim 7 further comprising a degassing apparatus for circulating a reaction gas through the molten silicon.

9. The apparatus of claim 2 wherein the cooling jacket comprises a vertically oriented jacket outer wall having an inwardly oriented open jacket annular top and bottom walls so that when the cooling jacket is disposed vertically around the height of the exterior wall of the vessel, the section of the exterior wall between the jacket annular top and bottom walls forms a substantially closed volume with the jacket outer, top and bottom walls, the at least one inlet and the at least one outlet in the jacket outer wall opening into the substantially closed volume.

10. The apparatus of claim 2 wherein the cooling jacket comprises a vertically oriented jacket outer wall having an inwardly oriented closed jacket top and bottom annular walls having its inner perimeters connected to a vertically oriented jacket inner wall so that a substantially closed volume is formed between the jacket outer, top bottom and inner walls, the at least one inlet and the at least one outlet in the jacket outer wall opening into the substantially closed volume.

11. The apparatus of claim 10 further comprising a plurality of perforations in the jacket inner wall.

12. The apparatus of claim 2 further comprising an alternating power source connected to the alternating current power supply terminals of each one of the plurality of induction coils via an arrangement of switching devices.

13. The apparatus of claim 2 further comprising a vacuum apparatus for maintaining the silicon in the vessel at near vacuum conditions or other controlled environment.

14. The apparatus of claim 13 further comprising a degassing apparatus for circulating a reaction gas through the molten silicon.

* * * * *